United States Patent
Cheng

(10) Patent No.: US 7,498,104 B2
(45) Date of Patent: Mar. 3, 2009

(54) PHASE SHIFT PHOTOMASK

(75) Inventor: Yung-Feng Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 805 days.

(21) Appl. No.: 10/711,160

(22) Filed: Aug. 28, 2004

(65) Prior Publication Data
US 2006/0046157 A1 Mar. 2, 2006

(51) Int. Cl.
G03F 1/08 (2006.01)
G03F 1/14 (2006.01)

(52) U.S. Cl. .......................................................... 430/5
(58) Field of Classification Search ....................... 430/5
See application file for complete search history.

(56) References Cited

U.S. PATENT DOCUMENTS

| 5,358,807 | A | * | 10/1994 | Okamoto | 430/5 |
| 5,465,859 | A | * | 11/1995 | Chapple-Sokol et al. | 430/5 |
| 6,010,807 | A | * | 1/2000 | Lin | 430/5 |
| 2003/0077519 | A1 | * | 4/2003 | Hsu | 430/5 |
| 2005/0048377 | A1 | * | 3/2005 | Yang | 430/5 |
| 2006/0046157 | A1 | * | 3/2006 | Cheng | 430/5 |
| 2007/0020532 | A1 | * | 1/2007 | Shieh et al. | 430/5 |

* cited by examiner

Primary Examiner—Mark F Huff
Assistant Examiner—John Ruggles
(74) Attorney, Agent, or Firm—Jianq Chyun IP Office

(57) ABSTRACT

A phase shift photomask is described, including a transparent substrate, and at least one isolated linear pattern, dense linear patterns and a transparent phase-shift region on the substrate. The isolated linear pattern includes a transparent end portion with a phase shift of 180° relative to the substrate. The transparent phase-shift region is located on the substrate adjacent to the ends of the dense linear patterns, and has a phase shift of 90° relative to the substrate.

19 Claims, 1 Drawing Sheet

PHASE SHIFT PHOTOMASK

BACKGROUND OF INVENTION

1. Field of the Invention

The present invention relates to a structure of a photomask used in an exposure process. More particularly, the present invention relates to a structure of a phase shift photomask that is capable of reducing the line-end shortening (LES) effect.

2. Description of the Related Art

As the linewidth of semiconductor process rapidly goes down, shortening the wavelength of exposure light in lithography is always desired. However, since short-wavelength exposure systems are difficult to design, most of advanced processes have linewidths shorter than the wavelength of the exposure light. For example, in an advanced 90 nm process, ArF excimer laser of 193 nm is usually used as an exposure light source.

However, when the process linewidth goes down to approximately one half of the exposure wavelength, the resolution of an exposure process using a conventional binary photomask is insufficient. Therefore, various phase shift photomasks are developed, which utilize optical interference effect to enhance the contrast of pattern transfer and improve the resolution of exposure process.

For example, a half-tone (HT) phase shift photomask as shown in FIG. 1 is usually used to form isolated and dense line patterns. The HT photomask includes a transparent substrate 100 and isolated/dense line patterns 110/120, which are semi-transparent lines with a phase shift of 180° relative to the substrate 100. Nevertheless, significant line-end shortening (LES) effect still occurs to the isolated photoresist line pattern 12 and the dense photoresist line patterns 14 obtained by using the above HT photomask, as indicated by $LES_I$ and $LES_D$ in FIG. 1. Consequently, electrically connecting with the conductive lines defined by the isolated/dense photoresist line patterns is difficult.

SUMMARY OF INVENTION

In view of the foregoing, this invention provides a phase shift photomask capable of reducing the line-end shortening (LES) effect in a lithography process.

The phase shift photomask of this invention includes a transparent substrate, and at least one isolated linear pattern, multiple dense linear patterns and a transparent phase-shift region on the substrate. The isolated linear pattern includes a transparent end portion with a phase shift of 180° relative to the substrate. The transparent phase-shift region is located on the substrate adjacent to the ends of the dense linear patterns, and has a phase shift of 90° relative to the substrate.

With the transparent π-shift end portion of the isolated linear pattern on the photomask, the line-end shortening effect of the resulting isolated linear photoresist pattern can be reduced. Meanwhile, the transparent π/2-shift region located adjacent to the ends of the dense linear patterns on the photomask can reduce the line-end shortening effect of the resulting dense linear photoresist patterns.

It is to be understood that both the foregoing general description and the following detailed description are exemplary, and are intended to provide further explanation of the invention as claimed.

DETAILED DESCRIPTION

Figure 2:
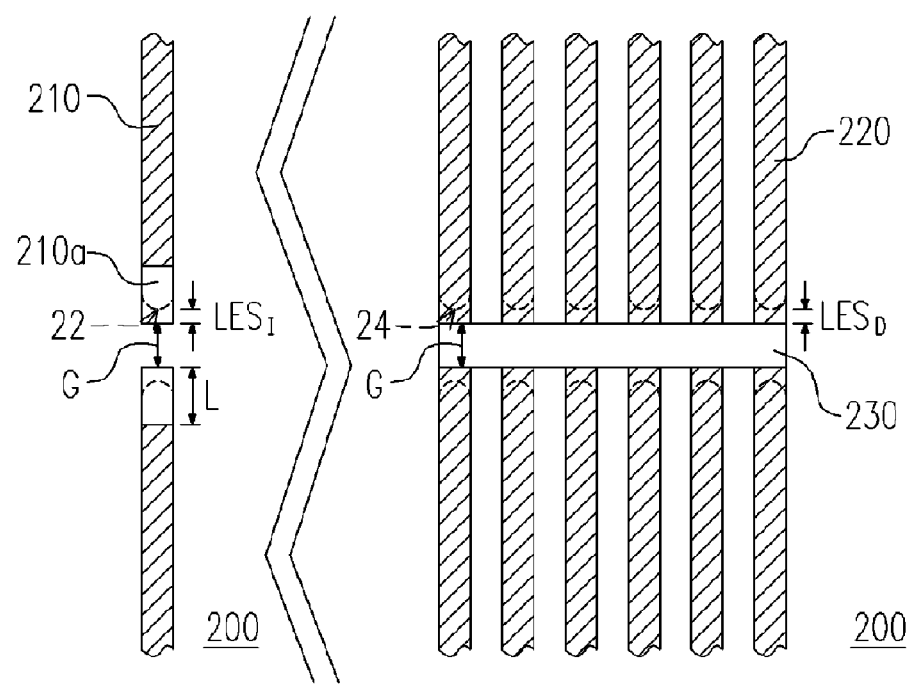
FIG. 2 illustrates a phase shift photomask including isolated/dense line patterns according to a preferred embodiment of this invention, the profiles of the resulting photoresist line patterns and the reduced line-end shortening effect.

Referring to FIG. 2, the phase shift photomask according to the preferred embodiment of this invention includes a transparent substrate 200, and isolated line patterns 210, dense line patterns 220 and a trans parent phase-shift region 230 on the substrate 200. Each isolated line pattern 210 includes a transparent end portion 210a with a phase shift of 180° relative to the substrate 200. The transparent phase-shift region 230 is located on the substrate 200 adjacent to the ends of the dense line patterns 220, and has a phase shift of 90° relative to the substrate 200.

In addition, the isolated line patterns 210 and the dense line patterns 220 in FIG. 2 are respectively arranged in pairs, wherein two line patterns 210 or 220 as a pair are opposite to each other in end-to-end arrangement. More specifically, the two isolated line patterns 210 as a pair are arranged so that their end portions 210a face each other. The dense line patterns 220 include two groups respectively disposed on two opposite sides of the transparent phase-shift region 230, wherein the end portions of the dense line patterns 220 in one group are adjacent to the transparent phase-shift region 230 and opposite to those in the other group. Such a pattern design is frequently seen on a photomask used in a memory fabricating process.

The substrate 200 can be made from quartz or glass, for example, or any other material transparent to the exposure light. The dense line patterns 220 and the isolated line patterns 210 except their transparent end portions 210a may be opaque linear layers as in a conventional binary photomask, or semi-transparent linear layers with a phase shift of 180° relative to the substrate 200 as in a conventional HT photomask. In the latter case, the transparency of the semi-transparent linear layers may be 6%, and the semi-transparent linear layers may be constituted of metal-containing layers, such as, chromium layers, that are sufficiently thin to be semi-transparent.

On the other hand, the transparent end portions 210a of the isolated line patterns 210 and the transparent phase-shift region 230 may be recessed portions of the substrate 200, wherein the π-shift end portion 210a of an isolated line pattern 210 is recessed more than the π/2-shift region 230.

Referring to FIG. 2 again, the profiles of the isolated and dense photoresist line patterns 22 and 24 obtained by using the above phase shift photomask are also shown in FIG. 2. As compared with the isolated/dense photoresist line patterns 12/14 obtained by using the conventional photomask of FIG. 1, the line-end shortening $LES_I/LES_D$ of the isolated/dense photoresist line patterns 22/24 is much reduced.

Figure 1:
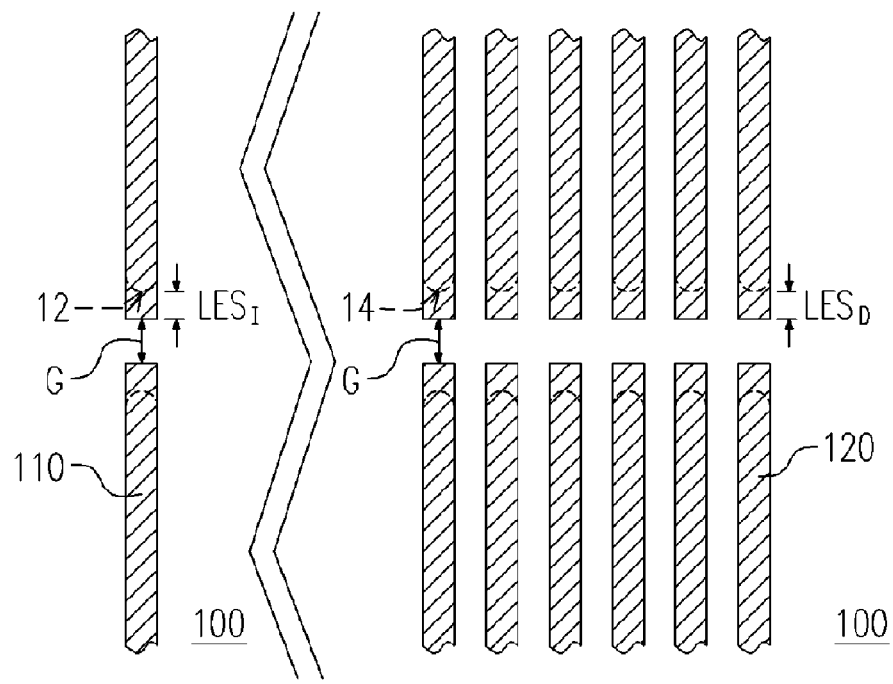
FIG. 1 illustrates a conventional half-tone photomask including isolated/dense line patterns, the profiles of the resulting photoresist line patterns in dashed lines and corresponding line-end shortening effect.

To demonstrate the effects of this invention, some simulations have been made to derive the LBS values of the isolated/dense photoresist line patterns obtained by using a conventional HT photomask of FIG. 1 and the phase shift photomask of FIG. 2, respectively. As the common parameters used in the simulations, the wavelength of the exposure light is 193 nm, the line/space width is 90/90 nm, and the gap width (G) between every two opposite line patterns is 100 nm. In addition, the length "L" of the transparent π-shift end portion 210a of each isolated line pattern 210 is 200 nm. The results of the simulations are listed in Table I.

TABLE I

Comparison for LES Effect of Conventional HT Mask
and Mask of This Invention (λ = 193 nm,
line/space width = 90/90 nm, G = 100 nm, L = 200 nm)

|  | 6% HT Mask | This Invention | LES Improvement |
| --- | --- | --- | --- |
| Dense Lines on-focus | 36.9 nm | 21.3 nm | 15.6 nm |
| Dense Lines defocus: 0.15 μm | 51.9 nm | 17.5/40.7 nm (+/−0.15 μm) | 34.4/11.2 nm (+/−0.15 μm) |
| Isolated Line on-focus | 36.6 nm | 3.6 nm | 33.0 nm |
| Isolated Line defocus: 0.15 μm | 85.6 nm | 33.4 nm | 52.2 nm |

As shown in Table I, with the transparent π-shift end portion of an isolated linear pattern on the photomask, the line-end shortening of the resulting isolated photoresist line pattern can be significantly reduced, even when the substrate is exposed at a defocused position in the exposure process. Meanwhile, the transparent π/2-shift region located adjacent to the ends of the dense line patterns can reduce the line-end shortening of the resulting dense photoresist line patterns, even when the substrate is exposed at a defocused position in the exposure process.

It is noted that though the line patterns are arranged in pairs in an end-to-end manner within the above embodiment, a single isolated line pattern having a transparent π-shift end portion, or a single group of dense line patterns with a transparent π/2-shift region adjacent to their ends, can also reduce the LES effect. Moreover, this invention not only is applicable to a photomask with isolated/dense line patterns thereon as in the above embodiment, but also can be applied to a photomask with other types of isolated/dense linear patterns thereon. In addition, the photomask of this invention may include merely isolated line patterns each having a transparent π-shift end portion, or merely dense line patterns with a transparent π/2-shift region adjacent to their ends.

It will be apparent to those skilled in the art that various modifications and variations con be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A phase shift photomask, comprising:
a transparent substrate;
at least one isolated linear pattern on the substrate, including a transparent end portion with a phase shift of 180° relative to the substrate;
a plurality of dense linear patterns on the substrate; and
a transparent phase-shift region, located on the substrate adjacent to ends of the dense linear patterns and having a phase shift of 90° relative to the substrate,
wherein no phase shift region is present between any two neighboring dense linear patterns that are arranged in a direction different from an extending direction of each dense linear pattern.

2. The phase shift photomask of claim 1, wherein the substrate comprises quartz or glass.

3. The phase shift photomask of claim 1, wherein the dense linear patterns and the isolated linear pattern except its transparent end portion each comprise an opaque linear layer.

4. The phase shift photomask of claim 1, wherein the dense linear patterns and the isolated linear pattern except its transparent end portion each comprise a semi-transparent linear layer with a phase shift of 180° relative to the substrate.

5. The phase shift photomask of claim 1, wherein the transparent end portion of the isolated linear pattern and the transparent phase-shift region each comprise a recessed portion of the substrate.

6. The phase shift photomask of claim 1, including a pair of opposite isolated linear patterns with their transparent end portions facing each other.

7. The phase shift photomask of claim 1, wherein the dense linear patterns include two groups of dense linear patterns separated by the transparent phase-shift region, wherein the ends of the dense linear patterns in each group are adjacent to the transparent phase-shift region.

8. A phase shift photomask, comprising:
a transparent substrate; and
an isolated linear pattern on the substrate, including a transparent end portion with a phase shift of 180° relative to the substrate and with a transparency equal to a transparency of the substrate around the isolated linear pattern, wherein an end of an isolated linear photoresist pattern is defined by the isolated linear pattern in a lithography process, and a position of the end of the isolated linear photoresist pattern corresponds to a position of the transparent end portion in the lithography process.

9. The phase shift photomask of claim 8, wherein the substrate comprises quartz or glass.

10. The phase shift photomask of claim 8, wherein the isolated linear pattern except its transparent end portion comprises an opaque linear layer.

11. The phase shift photomask of claim 8, wherein the isolated linear pattern except its transparent end portion comprises a semi-transparent linear layer with a phase shift of 180° relative to the substrate.

12. The phase shift photomask of claim 8, wherein the transparent end portion of the isolated linear pattern comprises a recessed portion of the substrate.

13. The phase shift photomask of claim 8, including a pair of opposite isolated linear patterns with their transparent end portions facing each other.

14. A phase shift photomask, comprising:
a transparent substrate;
a plurality of dense linear patterns on the substrate; and
a transparent phase-shift region, located on the substrate adjacent to ends of the dense linear patterns and having a phase shift of 90° relative to the substrate,
wherein no phase shift region is present between any two neighboring dense linear patterns that are arranged in a direction different from an extending direction of each dense linear pattern.

15. The phase shift photomask of claim 14, wherein the substrate comprises quartz or glass.

16. The phase shift photomask of claim 14, wherein the dense linear patterns comprise opaque linear layers.

17. The phase shift photomask of claim 14, wherein the dense linear patterns comprise semi-transparent linear layers with a phase shift of 180° relative to the substrate.

18. The phase shift photomask of claim 14, wherein the transparent phase-shift region comprises a recessed portion of the substrate.

19. The phase shift photomask of claim 14, wherein the dense linear patterns include two groups of dense linear patterns separated by the transparent phase-shift region, wherein the ends of the dense linear patterns in each group are adjacent to the transparent phase-shift region.

* * * * *